United States Patent
Carroll et al.

(10) Patent No.: US 6,211,541 B1
(45) Date of Patent: Apr. 3, 2001

(54) ARTICLE FOR DE-EMBEDDING PARASITICS IN INTEGRATED CIRCUITS

(75) Inventors: Michael Scott Carroll; Tony Georgiev Ivanov, both of Orlando, FL (US); Samuel Suresh Martin, Gillette, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/241,458

(22) Filed: Feb. 2, 1999

Related U.S. Application Data

(63) Continuation-in-part of application No. 09/243,377, filed on Feb. 1, 1999.

(51) Int. Cl.[7] .......................... H01L 27/108; H01L 29/76; H01L 31/119
(52) U.S. Cl. ............................ 257/275; 257/630; 257/652
(58) Field of Search ................................... 257/275, 630, 257/652, 776

(56) References Cited

U.S. PATENT DOCUMENTS

| | | |
|---|---|---|
| 4,727,319 | 2/1988 | Shahriary . |
| 5,384,486 | 1/1995 | Konno . |
| 5,391,914 | 2/1995 | Sullivan et al. . |
| 5,565,788 | 10/1996 | Burr et al. . |
| 5,594,393 | 1/1997 | Bischof . |
| 5,634,208 | 5/1997 | Nishikawa et al. . |
| 5,874,778 | 2/1999 | Bhattacharyya et al. . |
| 5,959,342 | 9/1999 | Shibib . |
| 6,043,556 | 3/2000 | Tomie . |

OTHER PUBLICATIONS

C. Wan et al., "A New Technique for In–Fixture Calibration Using Standards of Constant Length," IEEE Transactions on Microwave Theory, vol. 46, No. 9, Sep. 1998, pp. 1318–1320.

Primary Examiner—Stephen D. Meier
(74) Attorney, Agent, or Firm—Jason Paul DeMont; Wayne S. Breyer; DeMont & Breyer, LLC

(57) ABSTRACT

An article for de-embedding parasitics and/or acting as an on-wafer calibration standard is disclosed. In particular, some articles in accordance with the present invention provide structures on integrated circuits that mitigate the severity of parasitics Furthermore, some articles in accordance with the present invention are well-suited for use with conductive substrates that operate at high frequencies.

In an illustrative embodiment, conductive elements are used to construct structures near and/or around the leads on the integrated circuit. When the structures are grounded, the structures function to (at least) partially shield the leads to and from the DUT in a manner that is analogous to stripline, microstrip and coaxial cable. Because the electric fields emanating from the leads terminate in the grounded structure and not in the conductive substrate of the integrated circuit, the severity of the parasitics in the leads in mitigated.

An illustrative embodiment of the present invention is an integrated circuit comprising: a first pad, a first lead, a second pad, and a second lead made from a first conductive layer; a substrate; a first plate made from a second conductive layer that is between and electrically insulated from the first lead and the substrate; and a second plate made from the second conductive layer that is between and electrically insulated from the second lead and the substrate.

37 Claims, 13 Drawing Sheets

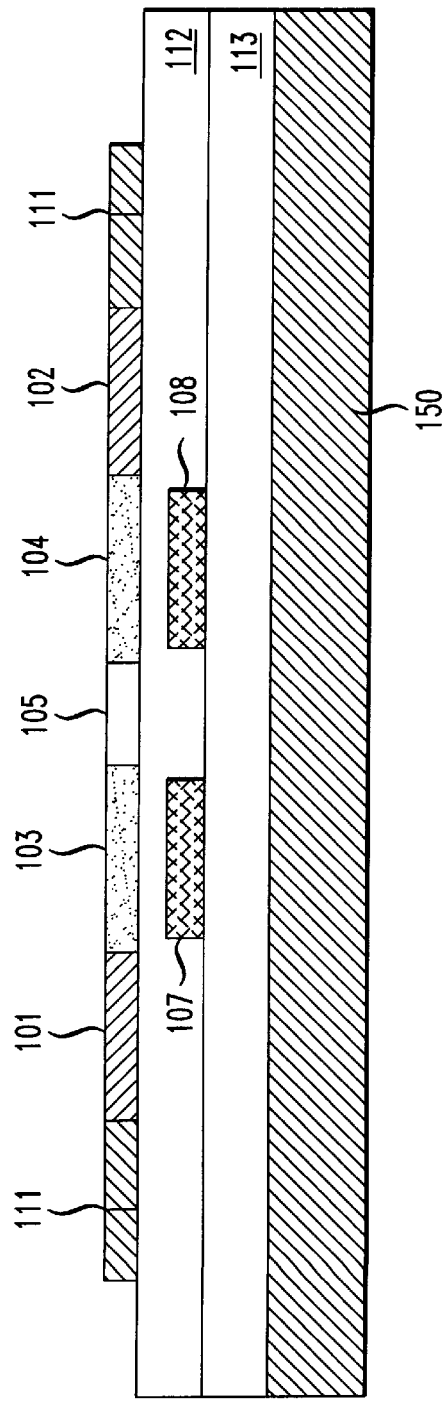
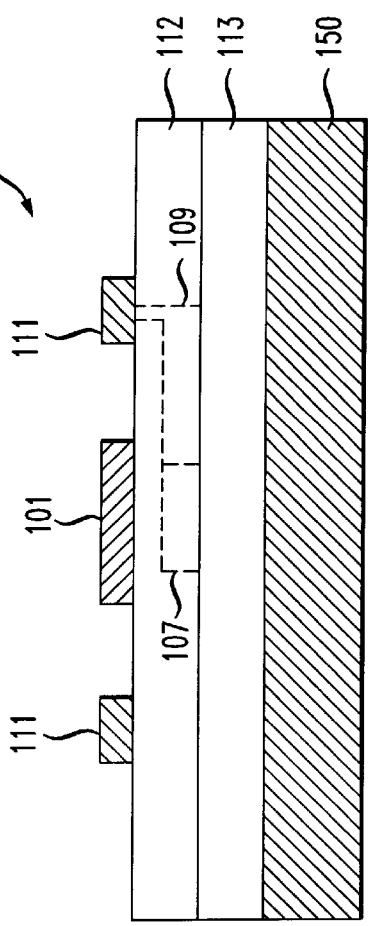

ARTICLE FOR DE-EMBEDDING PARASITICS IN INTEGRATED CIRCUITS

REFERENCE TO RELATED APPLICATION

This application is a continuation-in-part of application Ser. No. 09/243,377, filed Feb. 1, 1999, now pending, entitled "Integrated Circuit Comprising Means For High Frequency Signal Transmission", which application is incorporated by reference as if set forth in its entirety.

FIELD OF THE INVENTION

The present invention relates to semiconductor testing in general, and, more particularly, to an article that facilitates the de-embedding of parasitics in integrated circuits and that can also be used as a calibration standard for semiconductor test equipment.

BACKGROUND OF THE INVENTION

As is well known in the prior art, integrated circuits formed on semiconductor wafers typically comprise a variety of active and passive components (e.g., transistors, diodes, capacitors, interconnections, etc.). Typically, an integrated circuit is fabricated so that its components exhibit certain physical characteristics in accordance with a design specification, and, therefore, it is desirable to be able to verify that once an integrated circuit is manufactured its components do indeed exhibit the desired characteristics.

Because it is difficult to test an individual component in a typical integrated circuit, exemplars or "stand-alone" copies of the individual components are fabricated on the wafer and are analyzed as representative of the other components. Such analysis by representation is known as "in-process" or "on-chip" testing and is reasonable when the exemplars are fabricated using the same processes and design specifications as their counterparts.

In on-chip processing, the isolated exemplar, which is known as the "device under test" or "DUT," is electrically connected via leads to contact pads so that the physical characteristics of the DUT can be measured by external testing equipment. Typically, however, the leads to the DUT themselves hinder the measurement of the DUT itself because the leads exhibit physical characteristics that mask or obfuscate the physical characteristics of the DUT. Therefore, in order to accurately measure the physical characteristics of the DUT, the physical characteristics of the leads, which are known as "parasitics," must be understood so that they can be factored out to reveal the characteristics of the DUT. The process of factoring-out or extracting parasitics is referred to as "de-embedding" and is well known in the prior art.

As is also well known in the prior art, one method for de-embedding parasitics involves analyzing four special DUTs that are fabricated with the same process and in accordance with the same design specifications as the DUT of interest.

FIGS. 1a–1d depict representations of the four special DUTs, which are widely-known to those skilled in the art as "short," "load," "open," and "thru." For pedagogical reasons, the special DUTs in FIGS. 1a–1d are depicted so as to accentuate their similarities and differences. In particular, each of the special DUTs are similar in that each comprises a first lead, lead 103, that is electrically connected to a first contact pad (not shown) and second lead, lead 104, that is electrically connected to a second contact pad (not shown). It is through these contact pads that the physical character-istics of the special DUTs are measured using external measuring equipment.

FIG. 1a depicts the "short" DUT, in which each of lead 103 and lead 104 are electrically shorted to ground. FIG. 1b depicts the "load" DUT, in which lead 103 and lead 104 are each electrically connected to ground via a 50 ohm impedance. FIG. 1c depicts the "open" DUT, in which lead 103 and lead 104 are not connected at all (i.e., there is a gap between leads 103 and 104). Lastly, FIG. 1d depicts the "thru" DUT, in which lead 103 and lead 104 are electrically shorted to each other, but are not shorted to ground. It should be noted that the distinction between the short DUT in FIG. 1a and the thru DUT in FIG. 1d, is that the leads; of the thru DUT are not shorted to ground.

As is well-known in the prior art, test signals are applied to each of the four special DUTs and the responses are measured. From these measurements, the parasitics of the leads can be determined and applied in well-known fashion to de-embed the parasitics and reveal the "true" parameters of the nominal DUT.

Although this technique for de-embedding parasitics is well known and widely used, its use is problematic in some applications. In particular, integrated circuits with conductive substrates (e.g., silicon substrates, etc.) that operate at high frequencies generate particularly strong parasitics that hinder the de-embedding process. Therefore, the need exists for a means to de-embed parasitics associated with devices formed on conductive substrates and that operate at high frequencies.

SUMMARY OF THE INVENTION

Some embodiments of the present invention are capable of de-embedding parasitics without some of the costs and restrictions associated with means for doing so in the prior art. In particular, some embodiments of the present invention provide structures on the integrated circuits that mitigate the severity of parasitics. Furthermore, some embodiments of the present invention are particularly well-suited for use with integrated circuits that have conductive substrates and that operate at high frequency.

And still furthermore, some integrated circuits formed in accordance with the present invention are well-suited as calibration standards for test equipment. In other words, some integrated circuits formed in accordance with the present invention are well-suited for distribution to a plurality of locations so that the integrated circuit test equipment at those locations can be calibrated to a common benchmark.

In the illustrative embodiments described below, conductive elements are used to construct structures near and/or around the leads to and from the DUT. When the structures are grounded, they function to (at least) partially shield the leads to and from the DUT in a manner that is analogous to stripline, microstrip and coaxial cable. Because the electric fields emanating from the leads terminate in the grounded structures and not in the conductive substrate of the integrated circuit, the severity of the parasitics in those leads can be substantially mitigated. This facilitates their measurement and subsequent de-embedding.

The first illustrative embodiment of the present invention is an integrated circuit comprising: a first pad, a first lead, a second pad, and a second lead made from a first conductive layer; a substrate; a first plate made from a second conductive layer that is between and electrically insulated from the first lead and the substrate; and a second plate made from the second conductive layer that is between and electrically insulated from the second lead and the substrate.

BRIEF DESCRIPTION OF THE DRAWINGS

FIG. 3 depicts a cross-sectional elevation along the line I—I of FIG. 2.

FIG. 4 depicts a cross-sectional elevation along the line II—II of FIG. 2.

DETAILED DESCRIPTION

All of the illustrative embodiments of the present invention are integrated circuits that comprise two or more conductive layers. For the purposes of this specification, an "integrated circuit" is defined as a slice or chip of material on which is etched or deposited electronic components or interconnections or both. Also for the purposes of this specification, a "conductive layer" is defined as a layer of material or materials that have a substantially lower resistivity than its surrounding layers. Furthermore, it should be noted that a conductive layer is not necessarily limited to elemental metal layers but can, depending on the relative resistivity of the surrounding layers, also comprise a highly-doped semiconductor material, a conductive oxide, a nitride or other conductive compound. FIGS. 2–11 depict illustrative embodiments of the present invention that comprise two conductive layers, and FIGS. 12–19 depict illustrative embodiments that comprise three conductive layers.

Figure 1A:
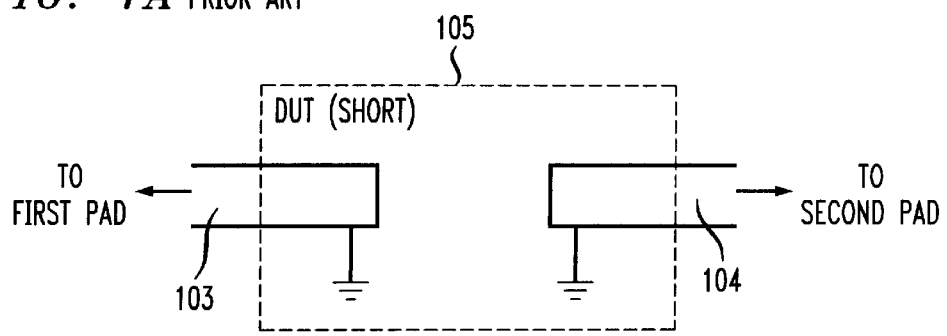
FIGS. 1a–1d depict DUTs used for measuring parasitics in the prior art.
Figure 1B:
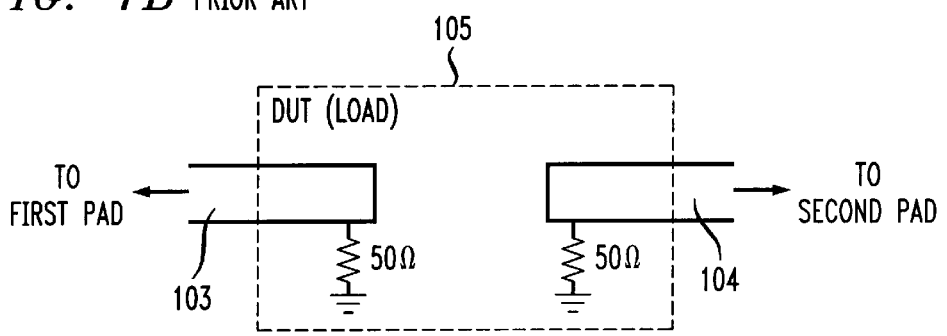
Figure 1C:
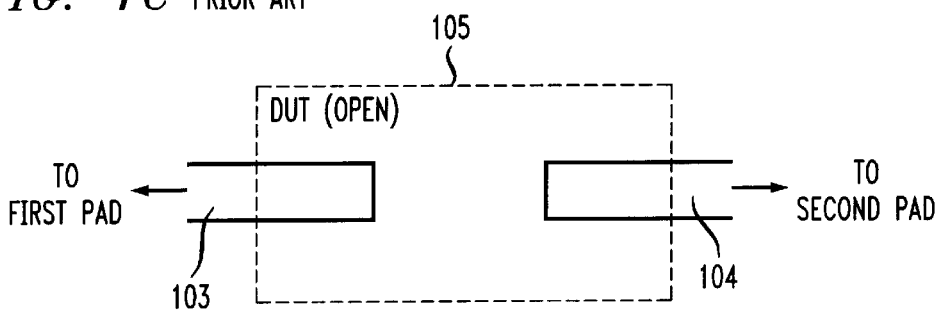
Figure 1D:
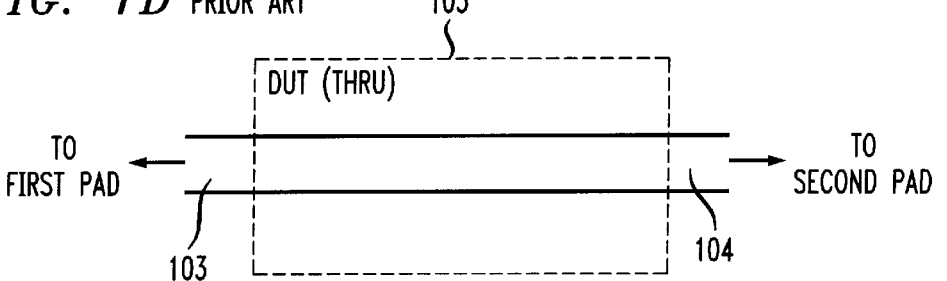
Figure 2:
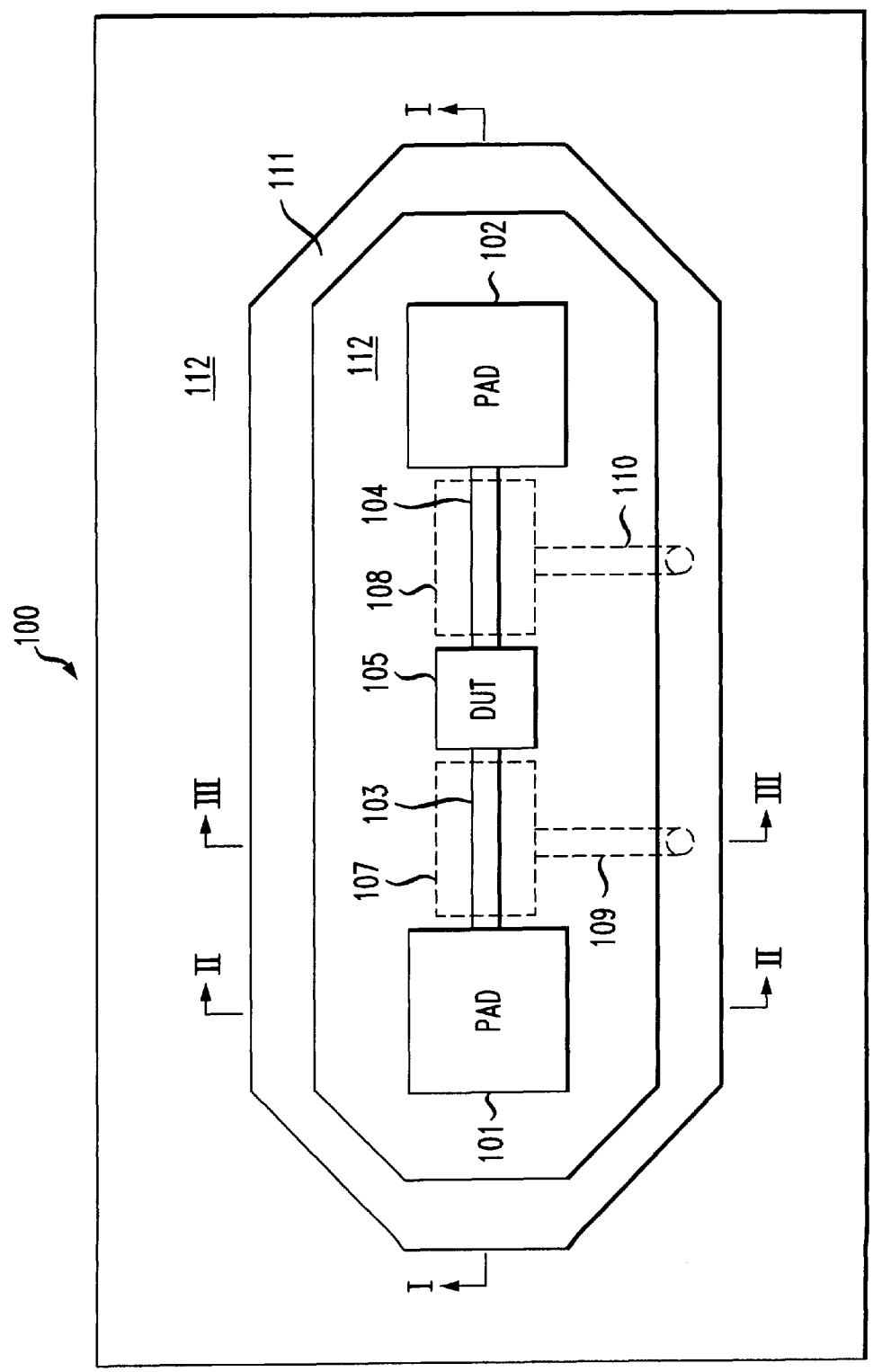
FIG. 2 depicts a plan view of the first illustrative embodiment of the present invention that comprises two conductive layers.

FIGS. 2–5 depict a first illustrative embodiment of the present invention, article 100, which can comprise a nominal DUT (e.g., a transistor, a diode, a capacitor, etc.) or a special DUT (e.g., one depicted in FIGS. 1a–1d, etc.). FIG. 2 depicts a plan view of article 100 and FIG. 3 depicts a cross-sectional view of article 100 along the line I—I of FIG. 2 (viewed as indicated in FIG. 2).

As depicted in FIG. 3, article 100 comprises an integrated circuit with five layers, or at least portions thereof, including substrate layer 150, second insulating layer 113 disposed on substrate layer 150, a second conductive layer that is disposed on second insulating layer 113, wherein the second conductive layer is patterned into, or otherwise comprises, plates 107 and 108, first insulating layer 112 disposed on second insulating layer 113 and plates 107 and 108, and a first conductive layer that is disposed on first insulating layer 112, wherein the first conductive layer is patterned into, or otherwise comprises, a variety of structures. It will be clear to those skilled in the art how to make and use other embodiments of the present invention that comprise more than five layers.

In particular, as shown in FIG. 2, the structures disposed on first insulating layer 112 include first contact pad 101 that is electrically connected to first lead 103, which is electrically connected to DUT 105. Also disposed on first insulating layer 112 is second contact pad 102 that is electrically connected to second lead 104, which is also electrically connected to DUT 105. Leads 103 and 104 are advantageously co-linear, as depicted in FIG. 2. Fence 111 advantageously surrounds the first and second contact pads, first and second leads and the DUT. The size and shape of fence 111 is advantageously chosen for compatibility with ground-signal-ground microprobes that connect an external signal source and measurement device to article 100.

As depicted in FIGS. 2 and 3, conductive plate 107 is disposed between first lead 103 and substrate layer 150. Moreover, conductive plate 107 is insulated from first lead 103 and substrate layer 150. Similarly, conductive plate 108 is disposed between second lead 104 and substrate layer 150, and is insulated therefrom. In FIG. 2, conductive plates 107 and 108 are depicted as being slightly shorter and somewhat wider than their corresponding leads. It should be understood that this is for pedagogical purposes only and that in other embodiments of the present invention conductive plates 107 and 108 can be smaller or larger than depicted in FIG. 2 with respect to their corresponding leads.

The purpose of conductive plate 107 and conductive plate 108 is similar to stripline, microstrip and coaxial cable, for without them, a high frequency signal on their corresponding leads would generate electric fields that would terminate in substrate layer 150 and generate parasitics. Therefore, when each conductive plate is grounded, some or all of the electric field emanating from its corresponding lead terminates in the conductive plate rather than in substrate layer 150. Furthermore, as is well known to those skilled in the art, the effectiveness of plates 107 and 108 begin to substantially diminish below a certain minimum width. Below such a minimum width, a non-trivial portion of the electric fields terminate in (conductive) substrate 150, which results in an increase in the incidence and severity of parasitics in article 100.

Suitable minimum dimensions and other considerations relevant to plates 107 and 108 (e.g., the distance between the plates and the "overlying" leads 103 and 104 and "underlying" substrate 150, etc.) may be determined by those skilled in the art with the use of a software tool, such as an electromagnetic (EM) simulator. Several commercially available EM simulators are MOMENTUM™, available from Hewlett-Packard Company of Palo Alto, Calif.; IE3D™ available from Zeland Software of Frement Calif., and SONNET™, available from Sonnet Software of Liverpool, N.Y. As a "rule-of-thumb," plates 107 and 108 are advantageously at least five times wider than leads 103 and 104.

Figure 5:
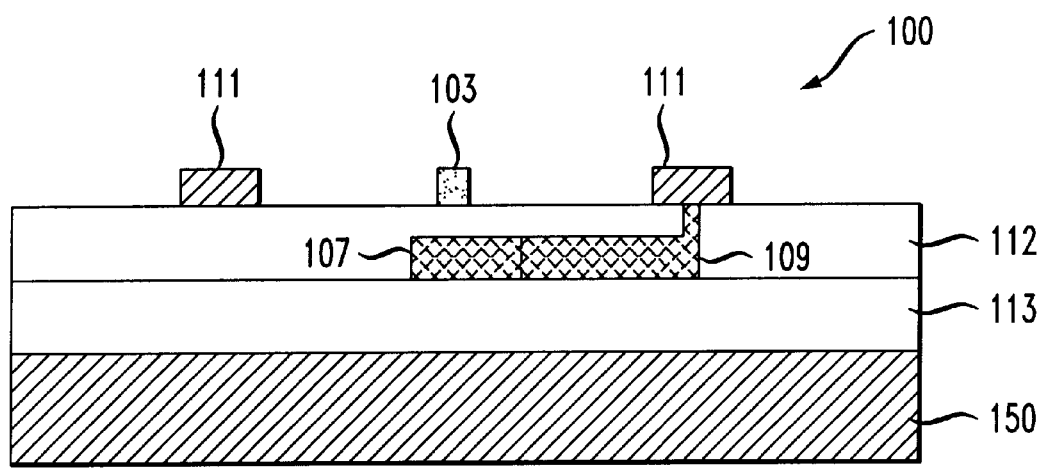
FIG. 5 depicts a cross-sectional elevation along the line III—III of FIG. 2.

As indicated in FIGS. 4 and 5, which are cross-sectional views through respective lines II—II and III—III of FIG. 2, plate 107 is electrically connected, via lead 109, to fence 111. Similarly, plate 108 is electrically connected, via lead 110, to fence 111.

By varying the specific configuration of DUT 105, any DUT can be implemented. For example, in one illustrative embodiment, the "short" DUT is implemented by configuring DUT 105 as, for example, a lead (not shown) that electrically connects leads 103 and 104 to fence 111, which, during measurement, is connected to "ground" microprobes. The "load" DUT is implemented, in one illustrative embodiment, by configuring a 50 ohm line from each of leads 103 and 104 to fence 111. To implement the "open" DUT, DUT 105 is an open circuit, such as, for example, a gap between leads 103 and 104. Configuring DUT 105 as a lead that electrically connects leads 103 and 104, but is not electrically connected to fence 111, provides an illustrative implementation of the "thru" standard.

Article 100 provides for ground-signal-ground testing as is advantageously used at RF frequencies. To facilitate such testing, microprobes for delivering a signal to article 100 are contacted to surface features at a first end of the arrangement. Specifically, a first microprobe (not shown) providing electrical connection to a signal source (not shown) is contacted, for example, to pad 101. Two microprobes (not shown) that flank the first microprobe and that are electrically connected to ground are contacted to fence 111. Response microprobes for delivering an output signal to the measurement apparatus (not shown) contact surface features of article 100 at a second end thereof. Specifically, a second microprobe (not shown) providing electrical connection to the measurement apparatus is contacted, for example, to pad 102. Two additional microprobes (not shown) that flank the second microprobe and that are electrically connected to ground are to contact fence 111.

In operation, test signals are applied to the four special DUTs and to the DUT of interest. Using the measured responses from the special DUTs in conjunction with well-known algorithms, the parasitics are then de-embedded from the measured response of the DUT of interest.

Figure 6:
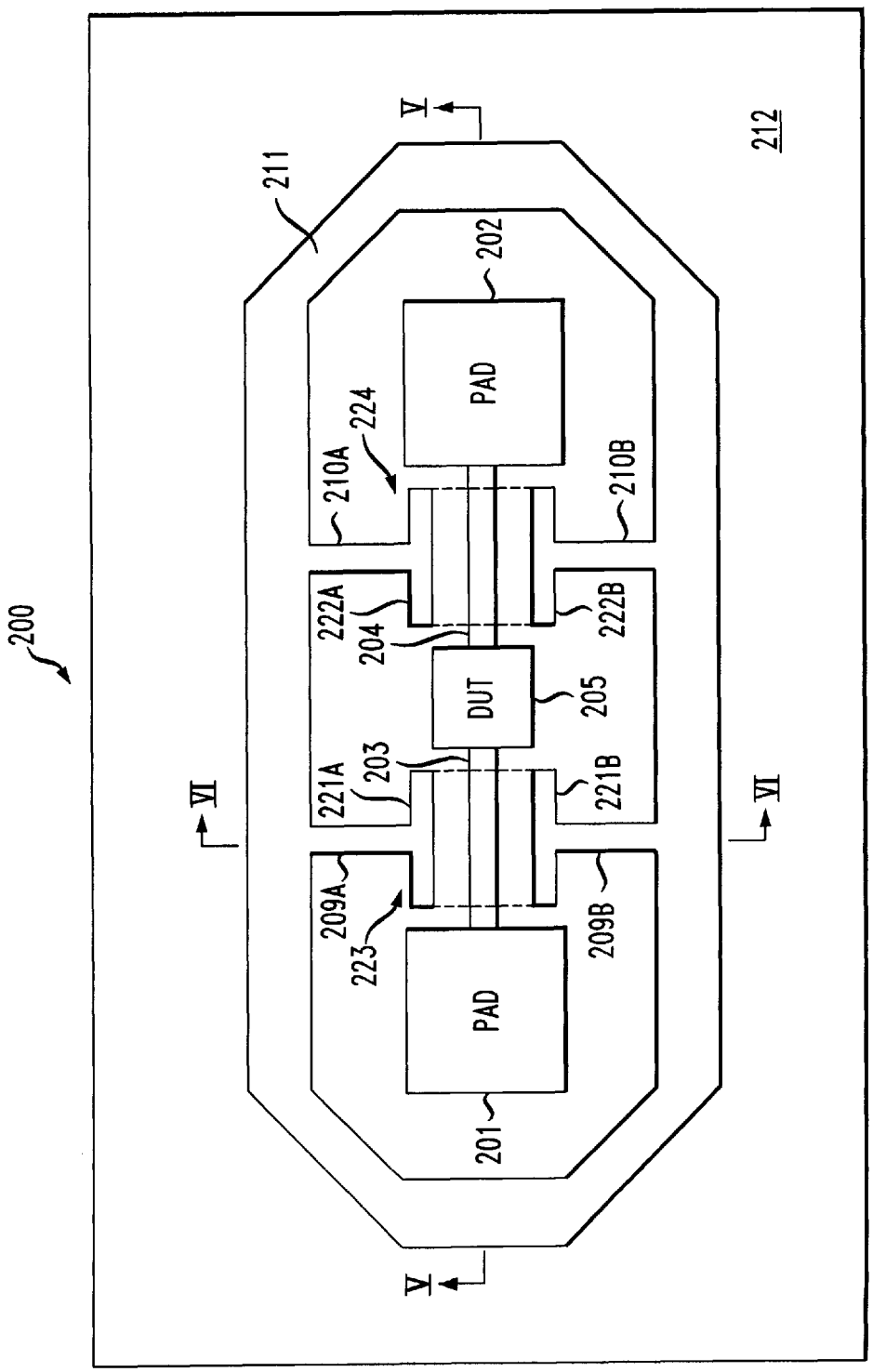
FIG. 6 depicts a plan view of the second illustrative embodiment of the present invention that comprises two conductive layers.
Figure 7:
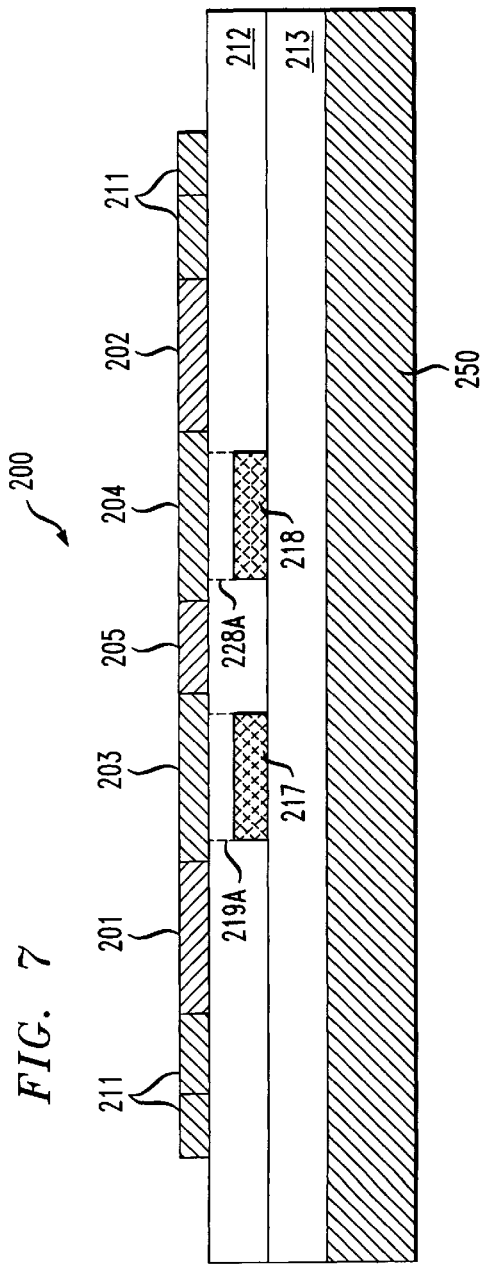
FIG. 7 depicts a cross-sectional elevation along the line V—V of FIG. 6.
Figure 8:
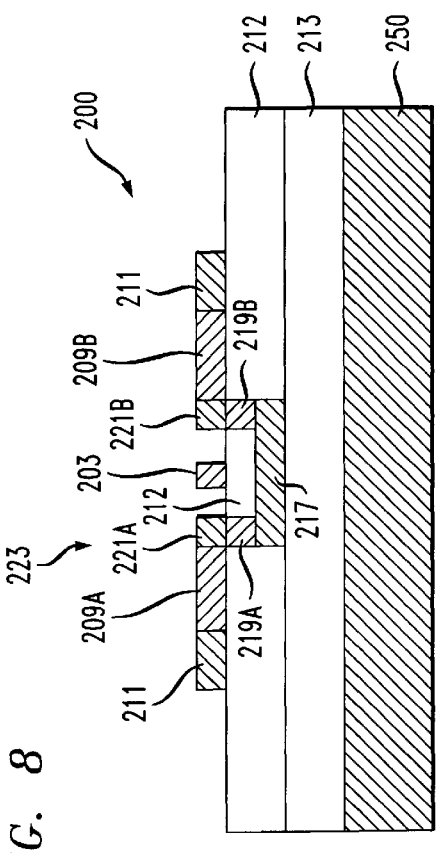
FIG. 8 depicts a cross-sectional elevation along the line VI—VI of FIG. 6.

FIGS. 6–8 depict a second illustrative embodiment of article 200. Like illustrative article 100, article 200 comprises two conductive layers. While in article 100, conductive plates 107 and 108 are simply disposed between respective leads 103 and 104, and substrate 150, in article 200, conductive troughs 223 and 224 partially enclose leads 103 and 104, as described below with further particularity. Such conductive troughs should further reduce the incidence and severity of parasitic signals in comparison to the conductive plates of article 100.

FIG. 6 depicts a plan view, FIG. 7 depicts a cross-sectional view along line V—V of FIG. 6, and FIG. 8 depicts a cross-sectional view along line VI—VI of FIG. 6 of illustrative article 200. As depicted in FIG. 7, article 200 comprises five layers, or at least portions thereof, including substrate layer 250, second insulating layer 213 disposed on substrate layer 250, a second conductive layer that is disposed on second insulating layer 213, wherein the second conductive layer is patterned into, or otherwise comprises, plates 217 and 218 defining bottom portions of respective troughs 223 and 224, first insulating layer 212 disposed on second insulating layer 213 and plates 217 and 219, and a first conductive layer that is disposed on first insulating layer 212, wherein the first conductive layer is patterned into, or otherwise comprises, a variety of structures.

The structures disposed on first insulating layer 212 include first contact pad 201 that is electrically connected to first lead 203. First lead 203 is also electrically connected to DUT 205. Also disposed on first insulating layer 212 is second contact pad 202 that is electrically connected to second lead 204. Second lead 204 is also electrically connected to DUT 205. Like leads 103 and 104 of apparatus 100, leads 203 and 204 are advantageously co-linear, as depicted in FIG. 6. Fence 211 advantageously surrounds the first and second contact pads, first and second leads and the DUT. The location of fence 211 is advantageously chosen for compatibility with ground-signal-ground microprobes that connect an external signal source and measurement device to article 200.

Trough 223 is depicted in cross section in FIG. 8. As shown in that Figure, trough 221 includes rims 221A and 221B, walls 219A and 219B and bottom portion 217, interrelated as shown. In the present illustrative embodiment, walls 219A and 219B are depicted as vertically-disposed plates. In other illustrative embodiments, such wall portions are not vertical, but are skewed outwardly from bottom to top such that the "opening" of such a trough at the level of the rims (e.g., rims 221A and 221B) is wider than the plate (e.g., plate 217) defining the bottom of the trough. In other illustrative embodiments, the walls are skewed inwardly from bottom to top. In still other illustrative embodiments, some of which are described later in this specification, the walls are not continuous in the manner of plate like wall 219A, but are segmented, in the manner of a jail cell comprised of plural vertically-disposed bars. Rather than being comprised of "bars," however, in illustrative embodiments described later herein, the trough wall is advantageously comprised of plural metallized vias or the like.

As depicted in FIGS. 6 and 8, trough 223 is electrically connected to fence 211 via leads 209A and 209B. Notwithstanding the use of two leads 209A and 209B in this illustrative embodiment, in other embodiments, a single lead for electrically connecting the fence to a trough may suitably be used. Moreover, while leads 209A and 209B are depicted as being "surface" leads, in other illustrative embodiments, they may be routed through underlying layers. Trough 224 is electrically connected to fence 211 via surface leads 210A and 210B.

Rims 221A and 221B and other surface features are depicted in the illustrative embodiment of FIG. 8 as being at the same relative elevation as lead 203, thereby partially enclosing the lead. It should be understood that neither such a similarity in relative elevation, nor partially enclosing leads 203/204 is required for practicing the present invention as embodied by illustrative article 200. In other illustrative embodiments, the rims and other surface features may be topographically higher or lower than lead 203. To the extent that the relative elevations of such surface features vary from illustrative embodiment to illustrative embodiment, relative to signal leads 203/204, such variation may result in changes in electric field distributions and differences in the incidence and severity of parasitics. Such changes can be estimated using EM simulators, as previously described.

As described previously for apparatus 100, by varying the specific configuration of DUT 205, any DUT can be implemented.

Figure 9:
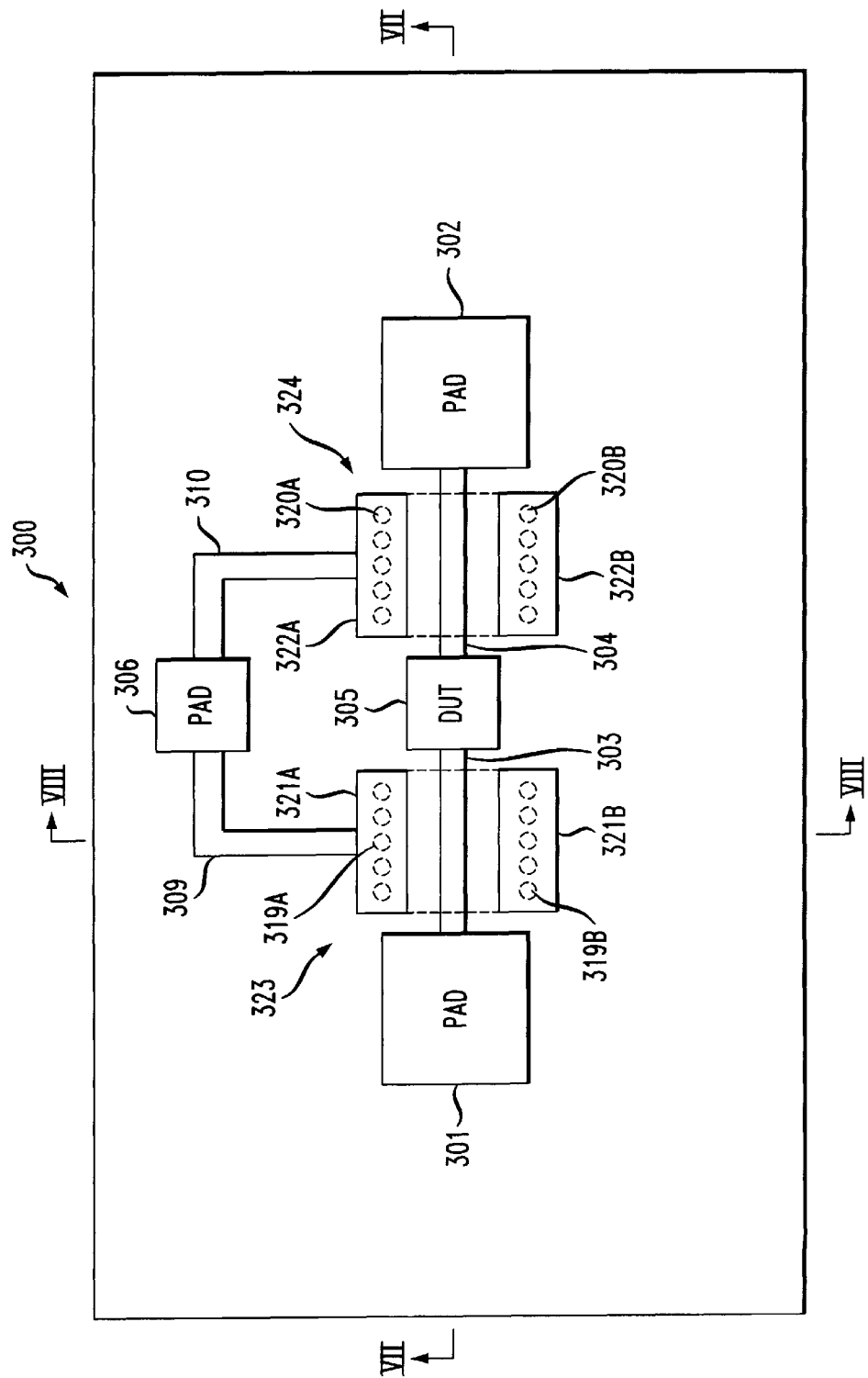
FIG. 9 depicts a plan view of the third illustrative embodiment of the present invention that comprises two conductive layers.
Figure 10:
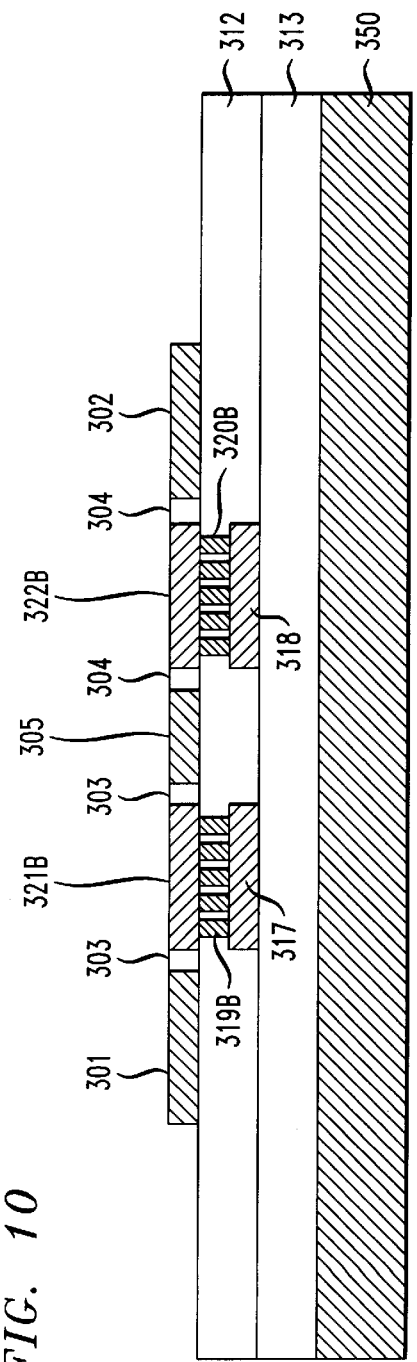
FIG. 10 depicts a cross-sectional elevation along the line VII—VII of FIG. 9.
Figure 11:
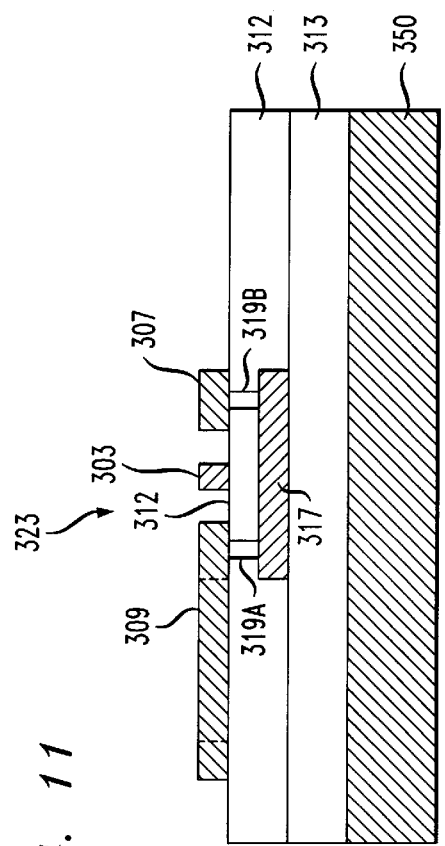
FIG. 11 depicts a cross-sectional elevation along the line VIII—VIII of FIG. 9.

FIGS. 9–11 depict a third illustrative embodiment, article 300. Like illustrative articles 100 and 200, article 300 comprises two conductive layers. Like article 200, article 300 incorporates conductive troughs (323 and 324) for electric field confinement. Unlike article 200, the "walls" of troughs 323 and 324 of article 300 are not plate-like structures; rather, such "walls," are defined by plural closely-spaced conductive vias. In a further distinction, article 300 does not include a fence, such as fences 111 and 211 of respective articles 100 and 200. Rather, article 300 employs a third contact pad. The third contact pad provides a ground contact as does the fence, but disadvantageously provides less shielding than does the fence.

FIG. 9 depicts a plan view, FIG. 10 depicts a cross-sectional view along line VII—VII of FIG. 9, and FIG. 11 depicts a cross-sectional view along line VIII—VIII of FIG. 9 of illustrative article 300. As depicted in FIG. 10, article 300 possesses the same five-layer structure as the previous illustrative embodiments. Such layers include, substrate layer 350, second insulating layer 313, a second conductive layer that is disposed on second insulating layer 313, wherein the second conductive layer is patterned into, or otherwise comprises, plates 317 and 318 that define the bottom of respective troughs 323 and 324, first insulating layer 312, and a first conductive layer that is disposed on first insulating layer 312, wherein the first conductive layer is patterned into, or otherwise comprises, a variety of structures.

The structures disposed on first insulating layer 312 include first contact pad 301 that is electrically connected to first lead 303, which is in turn electrically connected to DUT 305. Also disposed on first insulating layer 312 is second contact pad 302 that is electrically connected to second lead 204, which is in turn electrically connected to DUT 305. As in the previous illustrative embodiments, leads 303 and 304 are advantageously co-linear, as depicted in FIG. 9.

A third pad 306 is electrically connected to each of troughs 323 and 324 via respective surface leads 309 and 310. Illustrative article 300 thus provides a ground-signal arrangement, rather than a ground-signal-ground arrangement like the previously-described illustrative embodiments. As such, article 300 is advantageously used in conjunction with signals having a frequency well into the microwave range. Article 300 can, however, be readily modified for a ground-signal-ground arrangement. For example, in a first modification, an additional contact pad can be provided in a symmetrical fashion such that the pad is electrically connected to the troughs at rims 321B and 322B. Such an arrangement may, however, require a custom microprobe arrangement in view of the spacing and orientation of the ground pads (e.g., pad 306, etc.) relative to pads 301 and 302. To avoid such customizing, article 300 may be suitably modified by "deleting" pad 306 and by providing two pads that flank pad 301, which pads are electrically connected to trough 323, and an additional two pads that flank pad 302, which pads are electrically connected to trough 324.

As depicted in FIG. 10, plural vias 319B collectively define a first "wall" of trough 323. Such vias place the bottom of trough 323 (i.e., plate 317) in electrical contact with rim 321B. Similarly, plural vias 319A defining a second "wall" of trough 323 places plate 317 in electrical contact with rim 321A, which is in electrical contact with pad 306 through lead 309. Trough 324 is arranged in similar fashion.

As will be clear to those skilled in the art, the maximum allowable distance between adjacent vias is determined by the wavelength of the highest frequency signal whose field is to be confined.

As described previously for apparatus 100, by varying the specific configuration of DUT 305, any DUT can be implemented.

FIGS. 12–15 depict a fourth illustrative embodiment of an article 400 that is suitable for use in accordance with an illustrative embodiment of the present teachings. Like previously-described articles 100–300, article 400 incorporates the familiar arrangement of a DUT that is electrically connected via leads to contact pads for signal input and response output. Unlike those articles, however, article 400 comprises three conductive layers. The increase to three conductive layers facilitates forming conductive cage-like structures (i.e., cages 423 and 424) around the leads that are electrically connected to DUT 405 (i.e., leads 403 and 404).

Such cages are similar to troughs 323 and 324 of article 300 in that both the cages and those troughs possess a plate that defines a bottom and plural vias that define walls. Unlike troughs 323 and 324 that are "open" at rims 321A/321B and 322A/322B, the cages are "closed." More particularly, an additional plate is provided "above" each of leads 403 and 404 such that those leads are sandwiched between the bottom plate and the additional plate. Relative to the troughs, cages 423 and 424 provide even further confinement of electric fields emanating from leads 403 and 404 when signals pass through such leads.

Figure 12:
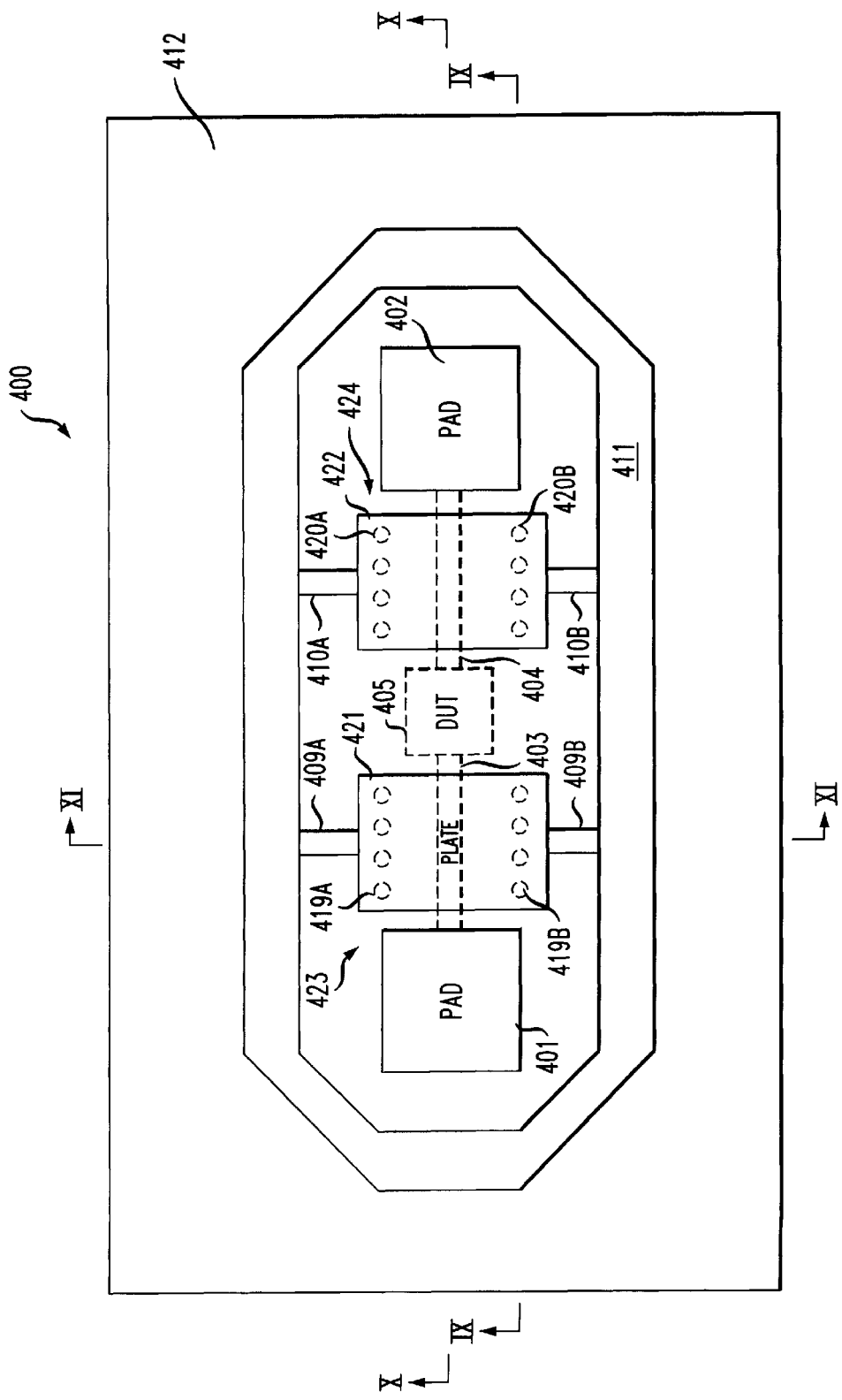
FIG. 12 depicts a plan view of the fourth illustrative embodiment of the present invention that comprises three conductive layers.
Figure 13:
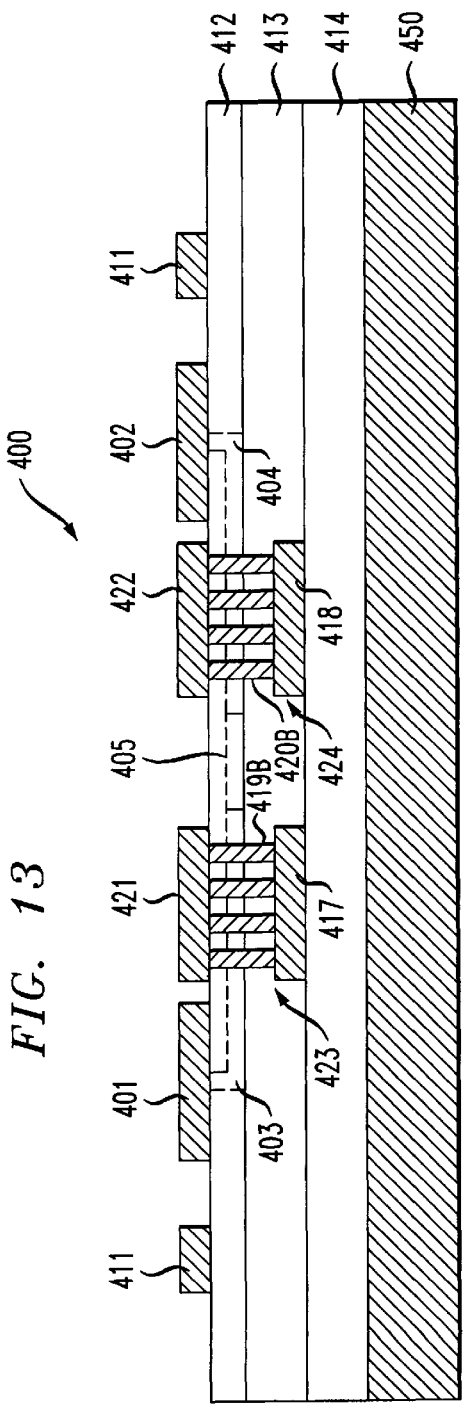
FIG. 13 depicts a cross-sectional elevation along the line IX—IX of FIG. 12.
Figure 14:
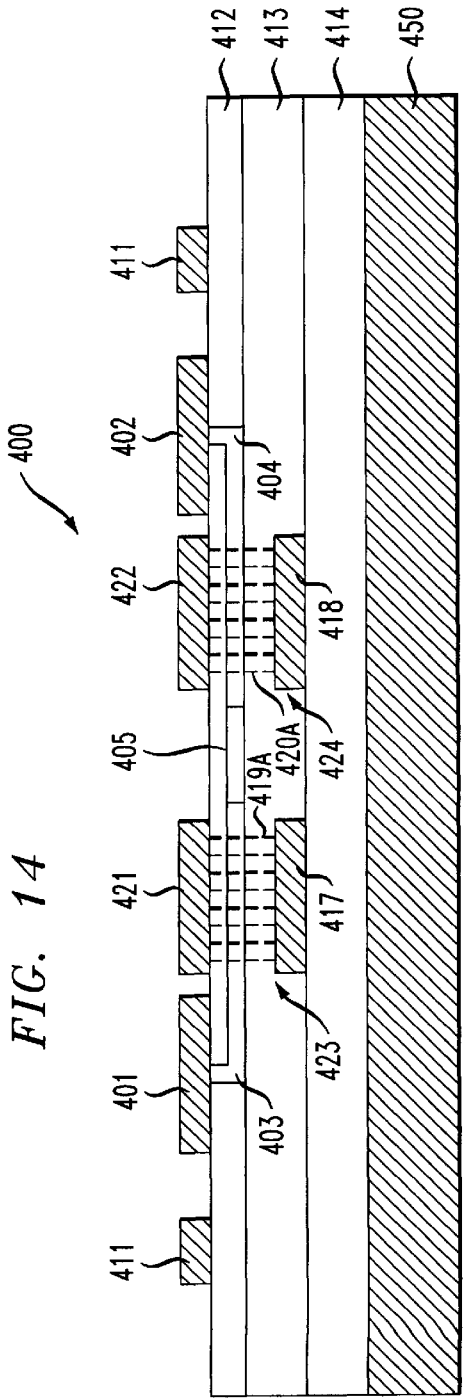
FIG. 14 depicts a cross-sectional elevation along the line X—X of FIG. 12.
Figure 15:
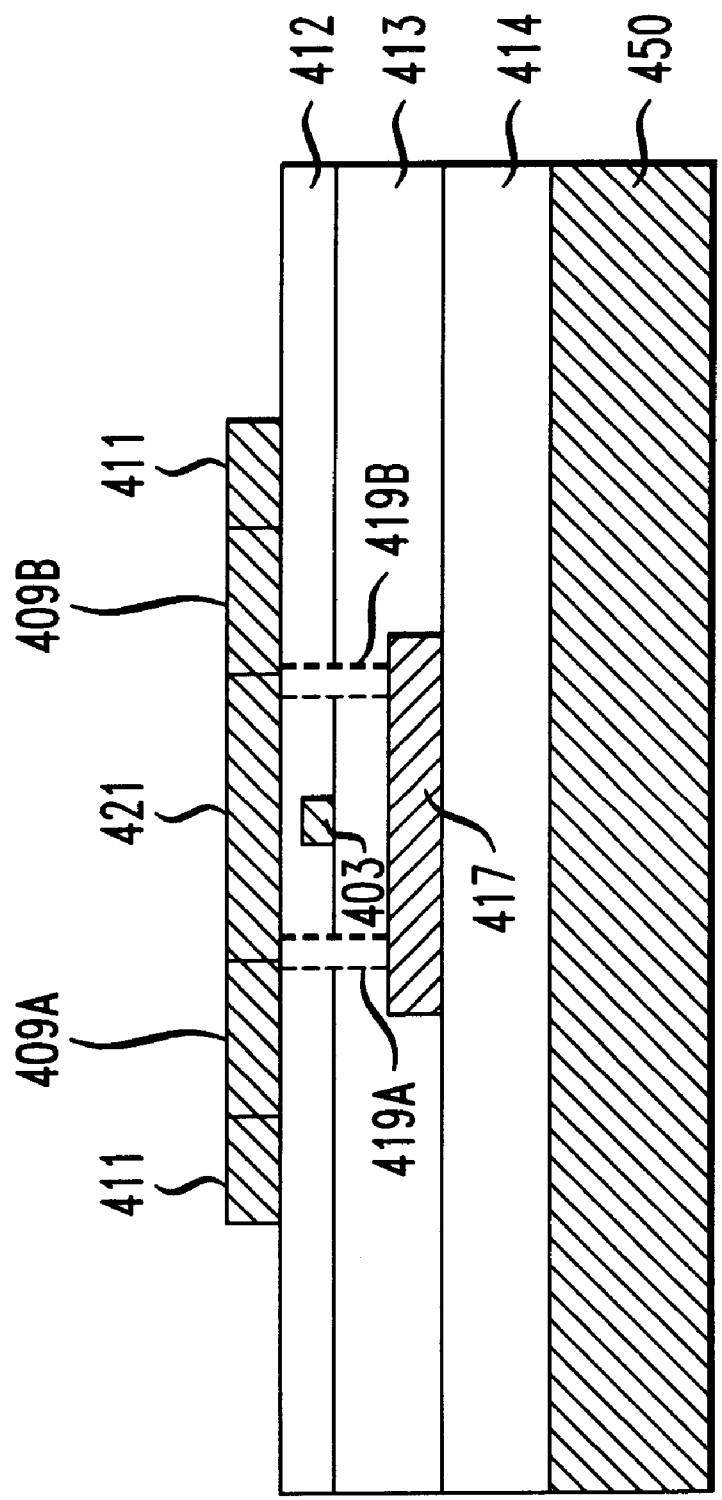
FIG. 15 depicts a cross-sectional elevation along the line XI—XI of FIG. 12.

FIG. 12 depicts a plan view, FIG. 13 depicts a cross-sectional view along line IX—IX of FIG. 12, FIG. 14 depicts a cross-sectional view along line X—X of FIG. 12, and FIG. 15 depicts a cross-sectional view along line XI—XI of illustrative article 400. As depicted in FIGS. 13–15, article 400 comprises six layers, or at least portions thereof, including substrate layer 450, third insulating layer 414 disposed on substrate layer 450, a third conductive layer that is disposed on third insulating layer 414, wherein the third conductive layer is patterned into, or otherwise comprises, plates 417 and 418 defining bottom portions of respective cages 423 and 424, second insulating layer 413 disposed on third insulating layer 414 and plates 417 and 418, a second conductive layer that is disposed on second insulating layer 413, wherein the second conductive layer is patterned into, or otherwise comprises, leads 403 and 404 and DUT 405, a first insulating layer 412 that is disposed on second insulating layer 413 and leads 403/404 and DUT 405, and a first conductive layer that is disposed on second insulating layer 412, wherein the first conductive layer is patterned into, or otherwise comprises, a variety of structures.

Structures disposed on first insulating layer 412 include first contact pad 401, second contact pad 402, "top" plates 421 and 422, leads 409A/409B and 410A/410B, all of which structures are enclosed by fence 411. Plate 421 defines the "top" of cage 423. Plate 421 is electrically connected to fence 411 via leads 409A and 409B. Similarly, plate 422 defines the top of cage 424, and is electrically connected to fence 411 via leads 410A and 410B.

First contact pad 401 is electrically connected via first lead 403 to DUT 405. Similarly, second contact pad 402 is electrically connected via second lead 404 to DUT 405. Unlike articles 100–300, in article 400 leads 403 and 404 are sandwiched between the top (i.e., plates 421/422) and the bottom (i.e., plates 417/418) of cages 423 and 424 (see FIGS. 13 and 14).

As depicted in FIG. 13, plural conductive (e.g., metallized) vias 419B collectively define a first "side" or "wall" of cage 423 and plural conductive vias 420B collectively define a first "side" or "wall" of cage 424. Such vias place the "bottom" (i.e., plates 417/418) of the cages in electrical contact with the "top" (i.e., plates 421/422) of the cages. Similarly, as depicted in FIG. 14, plural conductive vias 419A collectively define a second side or wall of cage 423 and plural conductive vias 420A collectively define a second side or wall of cage 424. As depicted in FIGS. 13 and 14, lead 403 is disposed between plural vias 419A and 419B and lead 404 is disposed between plural vias 420A and 420B.

Thus opposed plural vias 419A and 419B and opposed plates 417 and 421 define cage 423 through which lead 403 passes connecting pad 401 to DUT 405 (see, FIG. 15). Similarly, opposed plural vias 420A and 420B and opposed plates 418 and 422 define cage 424 through which lead 404 passes connecting pad 402 to DUT 405. Cages 423 and 424 significantly contain electric fields emanating from leads 403 and 404 when signals are passed through such leads.

As described previously for apparatus 100, by varying the specific configuration of DUT 405, any DUT can be implemented.

Figure 16:
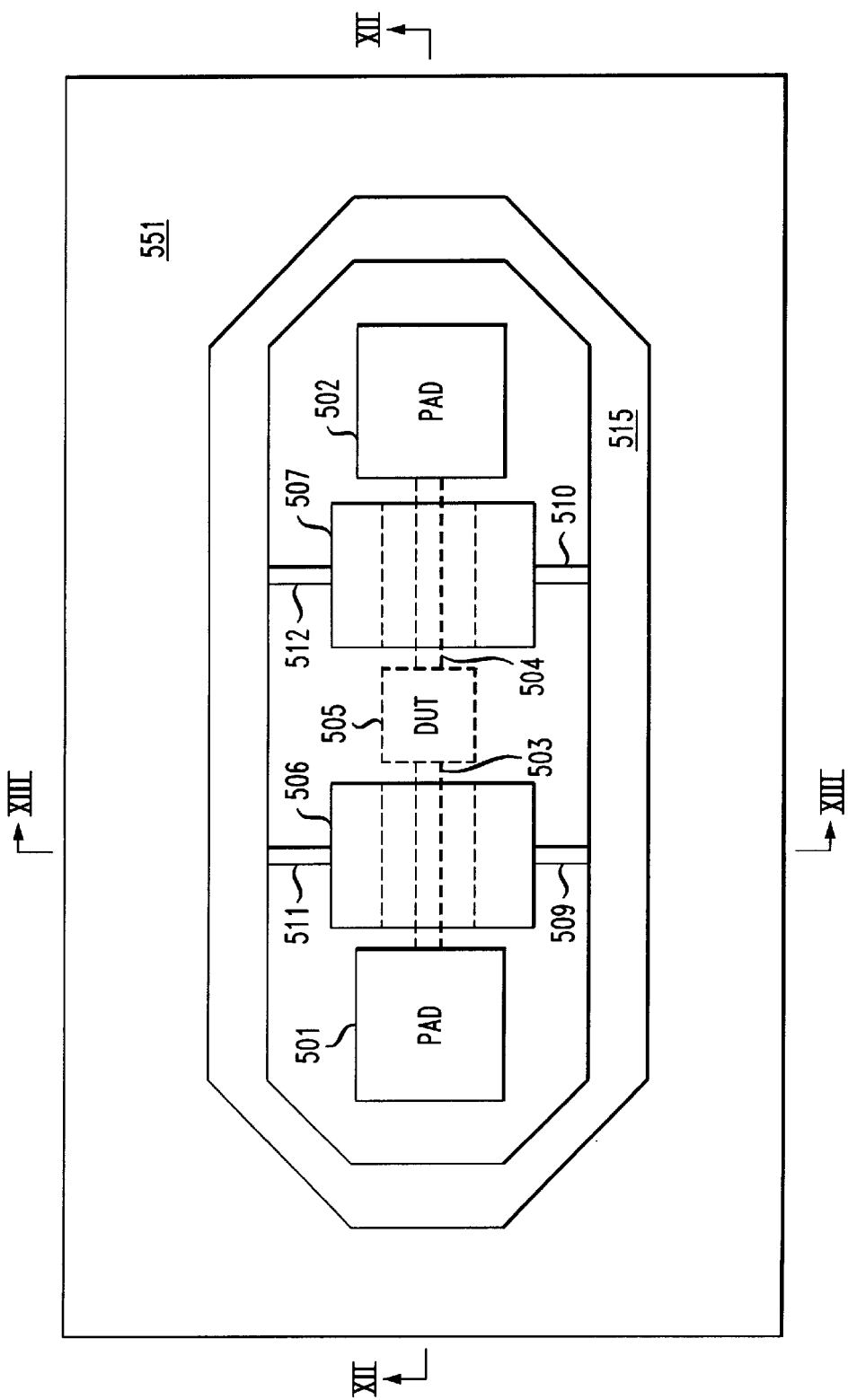
FIG. 16 depicts a plan view of the fifth illustrative embodiment of the present invention that comprises three conductive layers.
Figure 17:
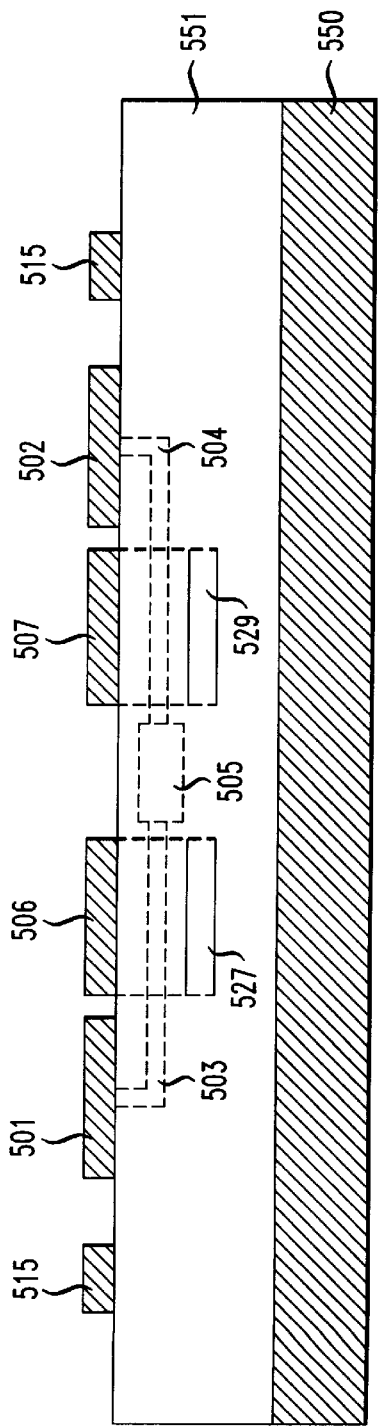
FIG. 17 depicts a cross-sectional elevation along the line XII—XII of FIG. 16.
Figure 18:
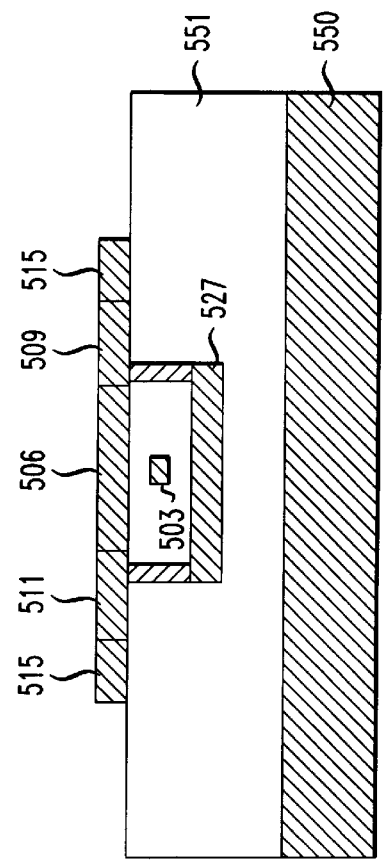
FIG. 18 depicts a cross-sectional elevation along the line XIII—XIII of FIG. 16.

FIGS. 16–18 depict a fifth illustrative embodiment, article 500. Article 500 includes a cage-like structure like article 400, and has a structure that is very similar thereto. In article 500, instead of using plural vias to form a solid "plate-like" wall, as the "sides" of the cages, such sides are "plate-like" in the manner of walls 219A/219B and 220A/220B of troughs 223/224.

It is to be understood that the above-described embodiments are merely illustrative of the invention and that many variations may be devised by those skilled in the art without departing from the scope of the invention. It is therefore intended that such variations be included within the scope of the following claims and their equivalents.

What is claimed is:

1. An integrated circuit comprising:
   a first pad, a first lead electrically connected to said first pad, a second pad, and a second lead electrically connected to said second pad, wherein said first pad, said first lead, said second pad and said second lead are made from a first conductive layer;
   a substrate;
   a first plate made from a second conductive layer that is between and electrically insulated from said first lead and said substrate; and
   a second plate made from said second conductive layer that is between and electrically insulated from said second lead and said substrate;
   wherein said first plate is substantially absent from between said first pad and said substrate and wherein said second plate is substantially absent from between said second pad and said substrate.

2. The integrated circuit of claim 1 wherein said substrate is conductive.

3. The integrated circuit of claim 2 further comprising:
   a first conductive trough that partially encloses said first lead, wherein said first conductive trough comprises a rim made from said fist conductive layer and a bottom made from said second conductive layer; and
   a second conductive trough that partially encloses said second lead, wherein said second conductive trough comprises a rim made from said second conductive layer and a bottom made from said second conductive layer.

4. The integrated circuit of claim 3 further wherein said first conductive trough comprises said first plate and said second conductive trough comprises second plate.

5. The integrated circuit of claim 1 further comprising a third pad that is electrically connected to said first plate and to said second plate.

6. The integrated circuit of claim 5 wherein said first lead is electrically connected to said third pad and said second lead is electrically connected to said third pad.

7. The integrated circuit of claim 5 wherein said first lead and said second lead are electrically connected to each other but are electrically insulated from said third pad.

8. The integrated circuit of claim 5 further comprising a fence made from said first conductive layer that surrounds and is electrically insulated from said first pad and said second pad, and that is electrically connected to said third pad.

9. The integrated circuit of claim 5 wherein said first lead is connected to said third pad via a 50 ohm impedance line and said second lead is electrically connected to said third pad by a 50 Ohm impedance line.

10. An integrated circuit comprising:
    a first pad, a first plate, a second pad, and a second plate made from a first conductive layer;
    a substrate;
    a first lead and a second lead made from a second conductive layer that is between said first conductive layer and said substrate, wherein said first lead is electrically connected to said first pad and said second lead is electrically connected to said second pad; and
    a third plate and a fourth plate made from a third conductive layer that is between said second conductive layer and said substrate;
    wherein said first lead is sandwiched between said first plate and said third plate and said first lead is electrically connected to said first pad; and
    wherein said second lead is sandwiched between said second plate and said fourth plate, and said second lead is electrically connected to said second pad.

11. The integrated circuit of claim 10 wherein said substrate is conductive.

12. The integrated circuit of claim 11 further comprising a third pad that is electrically connected to said first plate, said second plate, said third plate and said fourth plate.

13. The integrated circuit of claim 12 wherein said first lead is electrically connected to said third pad and said second lead is electrically connected to said third pad.

14. The integrated circuit of claim 12 wherein said first lead and said second lead are electrically connected to each other but are electrically insulated from said third pad.

15. The integrated circuit of claim 12 further comprising a fence made from said first conductive layer that surrounds and is electrically insulated from said first pad and said second pad, and that is electrically connected to said third pad.

16. The integrated circuit of claim 11 wherein said first lead is connected to said third pad via a 50 ohm impedance line and said second lead is electrically connected to said third pad by a 50 Ohm impedance line.

17. The integrated circuit of claim 11 further comprising:
    a first conductive duct that encloses said first lead, wherein said first conductive duct comprises a top made from said first conductive layer and a bottom made from said third conductive layer; and
    a second conductive duct that encloses said first lead, wherein said second conductive duct comprises a top made from said first conductive layer and a bottom made from said third conductive layer.

18. The integrated circuit of claim 17 wherein said first conductive duct comprises said first plate and said third plate and said second conductive duct comprises said second plate and said fourth plate.

19. The integrated circuit of claim 11 further comprising:
a first conductive cage that encloses said first lead, wherein said first conductive cage comprises a top made from said first conductive layer and a bottom made from said third conductive layer; and
a second conductive cage that encloses said first lead, wherein said second conductive cage comprises a top made from said first conductive layer and a bottom made from said third conductive layer.

20. The integrated circuit of claim 19 wherein said first conductive cage comprises said first plate and said third plate and said second conductive cage comprises said second plate and said fourth plate.

21. An integrated circuit comprising:
a first pad, a first lead electrically connected to said first pad, a second pad, and a second lead electrically connected to said second pad, wherein said first pad, said first lead, said second pad and said second lead are made from a first conductive layer;
a substrate;
a first plate made from a second conductive layer that is between and electrically insulated from said first lead and said substrate;
a second plate made from said second conductive layer that is between and electrically insulated from said second lead and said substrate; and
a fence made from said first conductive layer that surrounds and is electrically insulated from said first pad and said second pad.

22. The integrated circuit of claim 21 wherein said substrate is conductive.

23. The integrated circuit of claim 22 wherein said first lead is connected to said third pad via a 50 ohm impedance line and said second lead is electrically connected to said third pad by a 50 Ohm impedance line.

24. The integrated circuit of claim 21 further comprising a third pad that is electrically connected to said first plate and to said second plate.

25. The integrated circuit of claim 24 wherein said first lead is electrically connected to said third pad and said second lead is electrically connected to said third pad.

26. The integrated circuit of claim 24 wherein said first lead and said second lead are electrically connected to each other but are electrically insulated from said third pad.

27. The integrated circuit of claim 21 wherein said first plate is substantially absent from between said first pad and said substrate and wherein said second plate is substantially absent from between said second pad and said substrate.

28. The integrated circuit of claim 21 further comprising:
a first conductive trough that partially encloses said first lead, wherein said first conductive trough comprises a rim made from said first conductive layer and a bottom made from said second conductive layer; and
a second conductive trough that partially encloses said second lead, wherein said second conductive trough comprises a rim made from said second conductive layer and a bottom made from said second conductive layer.

29. The integrated circuit of claim 28 further wherein said first conductive trough comprises said first plate and said second conductive trough comprises said second plate.

30. An integrated circuit comprising:
a first pad, a first lead electrically connected to said first pad, a second pad, and a second lead electrically connected to said second pad, wherein said first pad, said first lead, said second pad and said second lead are made from a first conductive layer;
a substrate;
a first plate made from a second conductive layer that is between and electrically insulated from said first lead and said substrate;
a second plate made from said second conductive layer that is between and electrically insulated from said second lead and said substrate;
a first conductive trough that partially encloses said first lead, wherein said first conductive trough comprises a rim made from said first conductive layer and a bottom made from said second conductive layer; and
a second conductive trough that partially encloses said second lead, wherein said second conductive trough comprises a rim made from said second conductive layer and a bottom made from said second conductive layer.

31. The integrated circuit of claim 30 wherein said substrate is conductive.

32. The integrated circuit of claim 30 further comprising a third pad that is electrically connected to said first plate and to said second plate.

33. The integrated circuit of claim 32 wherein said first lead is electrically connected to said third pad and said second lead is electrically connected to said third pad.

34. The integrated circuit of claim 32 wherein said first lead and said second lead are electrically connected to each other but are electrically insulated from said third pad.

35. The integrated circuit of claim 30 wherein said first lead is connected to said third pad via a 50 ohm impedance line and said second lead is electrically connected to said third pad by a 50 Ohm impedance line.

36. The integrated circuit of claim 30 wherein said first plate is substantially absent from between said first pad and said substrate and wherein said second plate is substantially absent from between said second pad and said substrate.

37. The integrated circuit of claim 30 further wherein said first conductive trough comprises said first plate and said second conductive trough comprises said second plate.

* * * * *